United States Patent [19]

Aronowitz et al.

[11] Patent Number: 5,654,210

[45] Date of Patent: Aug. 5, 1997

[54] PROCESS FOR MAKING GROUP IV SEMICONDUCTOR SUBSTRATE TREATED WITH ONE OR MORE GROUP IV ELEMENTS TO FORM ONE OR MORE BARRIER REGIONS CAPABLE OF INHIBITING MIGRATION OF DOPANT MATERIALS IN SUBSTRATE

[75] Inventors: Sheldon Aronowitz; James Kimball, both of San Jose, Calif.

[73] Assignee: LSI Logic Corporation, Milpitas, Calif.

[21] Appl. No.: 434,673

[22] Filed: May 4, 1995

Related U.S. Application Data

[63] Continuation-in-part of Ser. No. 306,179, Sep. 13, 1994.

[51] Int. Cl.$^6$ ................................................. H01L 21/265
[52] U.S. Cl. ................................................. 438/526; 438/528
[58] Field of Search ................................. 437/24, 26, 10, 437/11, 152, 150, 959, 976, 27; 148/DIG. 58, DIG. 59, DIG. 157

[56] References Cited

U.S. PATENT DOCUMENTS

| | | | |
|---|---|---|---|
| 3,622,382 | 11/1971 | Brack et al. | 117/201 |
| 4,278,475 | 7/1981 | Bartko et al. | 148/1.5 |
| 4,889,819 | 12/1989 | Davari et al. | 437/27 |
| 5,075,751 | 12/1991 | Tomii et al. | 357/38 |
| 5,098,852 | 3/1992 | Niki et al. | 437/11 |
| 5,102,826 | 4/1992 | Ohshima et al. | 437/24 |
| 5,145,794 | 9/1992 | Kase et al. | 437/24 |
| 5,223,445 | 6/1993 | Fuse | 437/24 |
| 5,254,484 | 10/1993 | Hefner et al. | 437/24 |
| 5,296,387 | 3/1994 | Aronowitz et al. | 437/24 |
| 5,298,435 | 3/1994 | Aronowitz et al. | 437/24 |
| 5,389,563 | 2/1995 | Kuroi et al. | 437/26 |
| 5,401,674 | 3/1995 | Anjum et al. | 437/24 |
| 5,420,049 | 5/1995 | Russell et al. | 437/24 |
| 5,508,211 | 4/1996 | Yee et al. | 437/24 |
| 5,554,883 | 9/1996 | Kuroi | 437/11 |

FOREIGN PATENT DOCUMENTS

| | | | |
|---|---|---|---|
| 4035842 | 11/1990 | European Pat. Off. | 437/24 |
| 0 485 830 | 11/1991 | European Pat. Off. | |
| 5-190849 | 7/1993 | Japan . | |
| 6-151348 | 5/1994 | Japan . | |
| 6-163574 | 6/1994 | Japan . | |

OTHER PUBLICATIONS

Gibbons, James F., et al., *Projected Range Statistics: Semiconductors and Related Materials*, 2nd Ed., Stroudsburg, PA: Dowden, Hutchinson & Ross, Inc., 1975, pp. 3–27 and 4 unnumbered tables.

Kase, Masataka, et al., "$BF_2+$ Implantation in Predamaged Si with $Ge^+$ or $Si^+$ at Doses Lower than Amorphization", *Nuclear Instruments and Methods in Physics Research*, vol. B55, 1991, pp. 550–554.

Kase, Masataka, et al., "Eliminating Channeling Tail by Lower Dose Preimplantation", *Appl. Phys. Lett.*, vol. 56, No. 13, Mar. 26, 1990, pp. 1231–1232.

*Primary Examiner*—John Niebling
*Assistant Examiner*—S. Mulpuri
*Attorney, Agent, or Firm*—John P. Taylor

[57] ABSTRACT

Formation of a barrier region in a single crystal group IV semiconductor substrate at a predetermined spacing from a doped region in the substrate is described to prevent or inhibit migration of dopant materials from an adjacent doped region through the barrier region. By implantation of group IV materials into a semiconductor substrate to a predetermined depth in excess of the depth of a doped region, a barrier region can be created in the semiconductor to prevent migration of the dopants from the doped region through the barrier region. The treatment of the single crystal substrate with the group IV material is carried out at a dosage and energy level sufficient to provide such a barrier region in the semiconductor substrate, but insufficient to result in amorphization (destruction) of the single crystal lattice of the semiconductor substrate. In another embodiment, a similar barrier region may be formed in the semiconductor substrate but at a depth less than that of the doped region to inhibit migration of the dopant to the surface of the substrate. Such barrier regions may be formed in the substrate both above and below the doped region to inhibit migration of the dopant in the doped region in either direction.

14 Claims, 9 Drawing Sheets

```
┌─────────────────────────────────────────┐
│   PROVIDING A SINGLE CRYSTAL SILICON    │
│        SEMICONDUCTOR SUBSTRATE          │
└─────────────────────────────────────────┘
                    │
┌─────────────────────────────────────────┐
│   IMPLANTING THE SINGLE CRYSTAL SILICON │
│  SUBSTRATE WITH SILICON ATOMS AT A DOSAGE│
│   LEVEL AND ENERGY SUFFICIENT TO FORM A │
│  BARRIER REGION WHICH WILL INHIBIT MIGRATION│
│   OF OTHER DOPING MATERIALS THROUGH THE │
│      BARRIER REGION, BUT INSUFFICIENT TO│
│  AMORPHIZE THE SILICON IN THE BARRIER REGION│
└─────────────────────────────────────────┘
                    │
┌─────────────────────────────────────────┐
│  SUBSEQUENTLY DOPING A REGION IN THE SINGLE│
│   CRYSTAL SILICON SUBSTRATE ADJACENT THE │
│   BARRIER REGION WITH A GROUP II, GROUP III,│
│    GROUP V, OR GROUP VI DOPANT, WHEREBY │
│    THE BARRIER REGION WILL INHIBIT MIGRATION│
│    OF THE DOPANT FROM THE DOPED REGION  │
│     THROUGH THE BARRIER REGION TO OTHER │
│       PORTIONS OF THE SILICON SUBSTRATE │
└─────────────────────────────────────────┘
```

FIG. 9

PROCESS FOR MAKING GROUP IV SEMICONDUCTOR SUBSTRATE TREATED WITH ONE OR MORE GROUP IV ELEMENTS TO FORM ONE OR MORE BARRIER REGIONS CAPABLE OF INHIBITING MIGRATION OF DOPANT MATERIALS IN SUBSTRATE

CROSS-REFERENCE TO RELATED APPLICATIONS

This application is a continuation-in-part of U.S. patent application Ser. No. 08/306,179, filed Sep. 13, 1994.

BACKGROUND OF THE INVENTION

1. Field Of the Invention

This invention relates to the processing of semiconductor materials. More particularly, this invention relates to the treatment of a semiconductor substrate with one or more group IV elements to inhibit migration of dopant materials in the semiconductor substrate, and the resulting treated semiconductor substrate product.

2. Description of the Related Art

In the formation of semiconductor devices such as integrated circuit structures on a semiconductor substrate, such as, for example, a silicon wafer, dopant materials are conventionally added to the single crystal semiconductor substrate, usually by implantation and/or diffusion of the dopant material into the single crystal lattice to respectively provide an excess of one type of charge carrier, comprising either holes or electrons, in the crystal lattice, depending upon whether either p-type or n-type semiconductor material is desired. Typically, for example, a group IV semiconductor substrate such as silicon or germanium is doped with boron to provide a p-type semiconductor material, or is doped with phosphorus or arsenic to provide an n-type semiconductor material.

However, not only is the type of doping of the semiconductor substrate important, but the extent or concentration of the doping is also important for many applications or uses of doped semiconductor materials, for example, to achieve a lightly doped p–region, a p region, or a p+ region. For example, one may wish to construct a p channel or PMOS device comprising p+ source and drain regions in an n type well in a p– silicon semiconductor with p– lightly doped portions (ldds) between the heavily doped p+ drain region and the n doped channel beneath the gate electrode. Thus, the maintaining of different levels of dopant concentrations in various portions of a semiconductor material is also important to the performance of active devices made utilizing such doped regions of varying concentration. Therefore, after initial doping of a region of a semiconductor material, e.g., by an implantation procedure, it is very important that the migration of the dopant material out of the doped region be prevented, or at least inhibited.

Since the formation of semiconductor devices such as integrated circuit structures require a number of steps, including many steps involving the heating of the semiconductor substrate, and migration or diffusion of dopant materials through a semiconductor substrate is known to be accelerated with rises in temperature, it is often difficult to maintain a given concentration of dopant in a particular region without excessive migration. Even the initial doping of the substrate is usually carried out by means of (implantation) which requires subsequent annealing of the implanted semiconductor material at elevated temperatures to repair the damage done to the crystal lattice of the semiconductor material during the implantation step. Often it is, therefore, necessary to dope a substrate at a higher than desired concentration in order to compensate for dopant losses which will unavoidably occur by migration in order to achieve a particular desired final concentration of dopant in a given region after completion of the processing of the semiconductor substrate.

Kase et al. in "Eliminating Channeling Tail by Lower Dose Preimplantation", published in Applied Physics Letters 56 (13), 26 Mar. 1990, at pp. 1231–1232, describe the implantation of a silicon substrate with either silicon or germanium and its effect on channeling of implanted boron. In a later publication Kase et al., in "$BF_2^+$ Implantation in Predamaged Si with $Ge^+$ or $Si^+$ at Doses Lower than Amorphization", published in the Journal of the Electrochemical Society, Volume 138, No. 10, Oct. 1991, at pp. 550–554, describe what was apparently an initial increase in boron diffusion resulting from such an implantation of a silicon substrate with silicon, and the authors note that subsequent increases in the concentration of the silicon implantation until amorphization is reached resulted in reductions of the boron diffusion rate.

However, It would be desirable if one could, during and after implantation of a dopant material in a particular region of a semiconductor substrate, reliably control and inhibit migration of the dopant material from the doped region of the semiconductor substrate, by either channeling or diffusion, during the processing of the substrate.

SUMMARY OF THE INVENTION

In accordance with the invention, a single crystal group IV semiconductor substrate is treated with a group IV material to provide a barrier region in the substrate of predetermined spacing from a doped region of the substrate to thereby inhibit migration of dopant materials from the adjacent doped region through the barrier region. By implantation of such group IV materials into a semiconductor substrate to a predetermined depth in excess of the depth of a doped region, a barrier region can be created in the semiconductor to prevent migration of the dopants through the barrier region. In another embodiment, a barrier region of Group IV material may be implanted in the substrate to a depth less than that of the doped region to inhibit subsequent migration of the dopant to the surface of the substrate, e.g., for a retrograde well. Either or both of the Group IV barrier regions may be formed in the same Group IV semiconductor substrate. The treatment of the single crystal substrate with the group IV material is carried out at a dosage and energy level sufficient to provide such a barrier region or barrier regions in the semiconductor substrate, but insufficient to result in amorphization (destruction) of the single crystal lattice of the semiconductor substrate.

BRIEF DESCRIPTION OF THE DRAWINGS

FIG. 9 is a flow sheet illustrating the process of the invention.

DETAILED DESCRIPTION OF THE INVENTION

The invention provides a process for treating a single crystal group IV semiconductor substrate with group IV materials at a dosage and energy level sufficient to form a barrier region in the semiconductor substrate at a preselected distance from a doped region in the substrate to inhibit migration of dopant through the barrier region from the adjacent doped region of the substrate, but insufficient to result in amorphization of the single crystal lattice of the semiconductor substrate. This state of this portion of the group IV crystal lattice implanted with group IV atoms is characterized herein as a "sub-amorphous" state.

The term "migration", as used herein, is intended to define an undesirable movement of a dopant within a Group IV single crystal substrate. It includes diffusion from the original region of placement or a skewed distribution into the depth of the substrate during ion implantation because of alignment of the ion beam's direction with crystallographic planes with low Miller indices of the implanted substrate, i.e., channeling.

The term "amorphous" is intended to define a state of the normally single crystal substrate wherein, using Rutherford Basckscattering Spectroscopy, all principal channels are 100% disrupted; and wherein no diffraction pattern is exhibited when the amorphous portion of the substrate is subject to x-ray diffraction.

The terms "sub-amorphous" and "sub-amorphization" are, therefore intended to define a degree of non-crystallinity of a crystal lattice which is sufficient to inhibit the diffusion of dopant therethrough, but which, in a lightly doped region, would not result in a measurable change in the leakage current across the junction between the lightly doped region and an adjacent region, after annealing, which can be attributed to crystalline damage. That is, the amount of leakage current across such a junction in the "sub-amorphous" region, is the same as across the same junction in a crystalline region, i.e., is not changed by the group IV implantation. The term "lightly doped" in this context, is intended to define a dopant concentration in the order of $10^{19}$ atoms per cubic centimeter or less.

Figure 1:
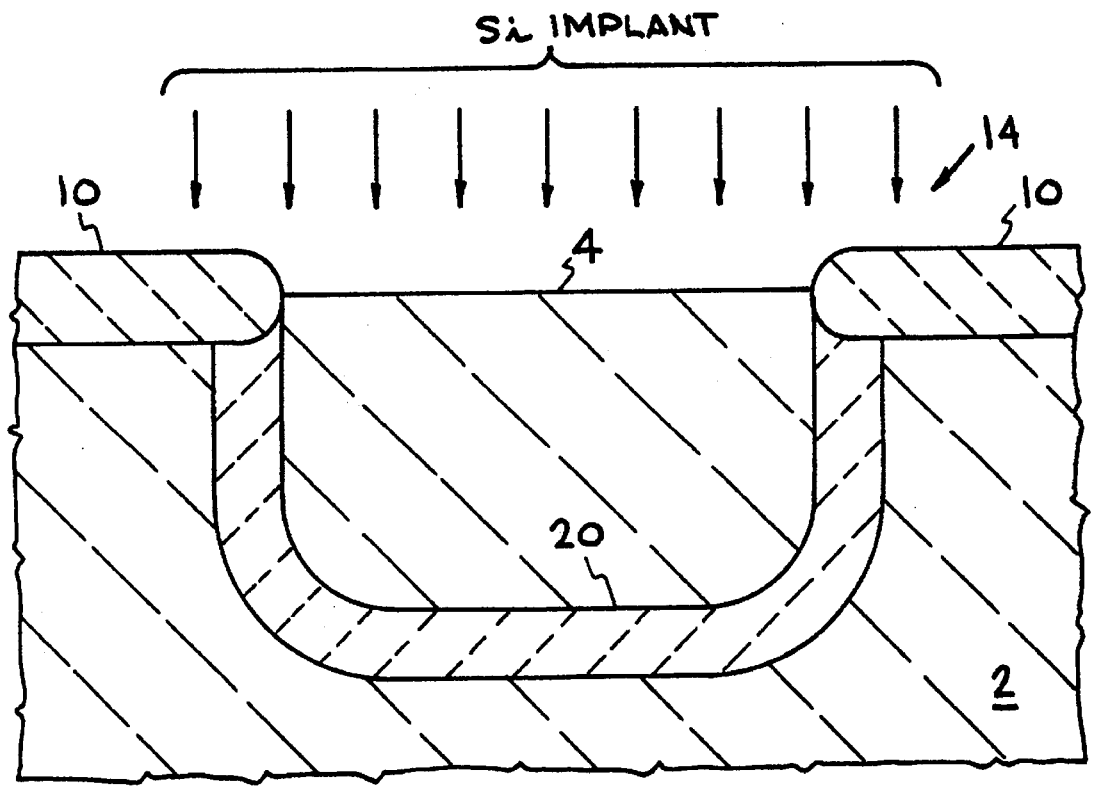
FIG. 1 is a fragmentary vertical cross-sectional view depicting a single crystal silicon (group IV) semiconductor substrate being implanted with silicon (group IV) atoms, in accordance with the process of the invention to form a barrier region of silicon (group IV) atoms in the substrate which inhibits migration of subsequently implanted dopant material therein.

Referring to FIGS. 1–4, the process and resultant product of the invention are illustrated. In FIG. 1, a single crystal group IV semiconductor substrate 2, such as a single crystal silicon substrate, is shown with a surface 4 and having field oxide portions 10 previously grown in surface 4. Single crystal silicon substrate 2 is shown, at 14, being implanted with silicon atoms at a sufficient energy to cause the silicon atoms to form a region or cluster of interstitial silicon atoms comprising barrier region 20 in substrate 2 spaced from surface 4. However, as will be further discussed below, the dosage and energy levels of the silicon implantation must be maintained in the sub-amorphous range, i.e., below that which would result in destruction (amorphizing) of the single crystal structure of the substrate in this region (or in the portion of the substrate above this region through which the implanted atoms pass).

Figure 2:
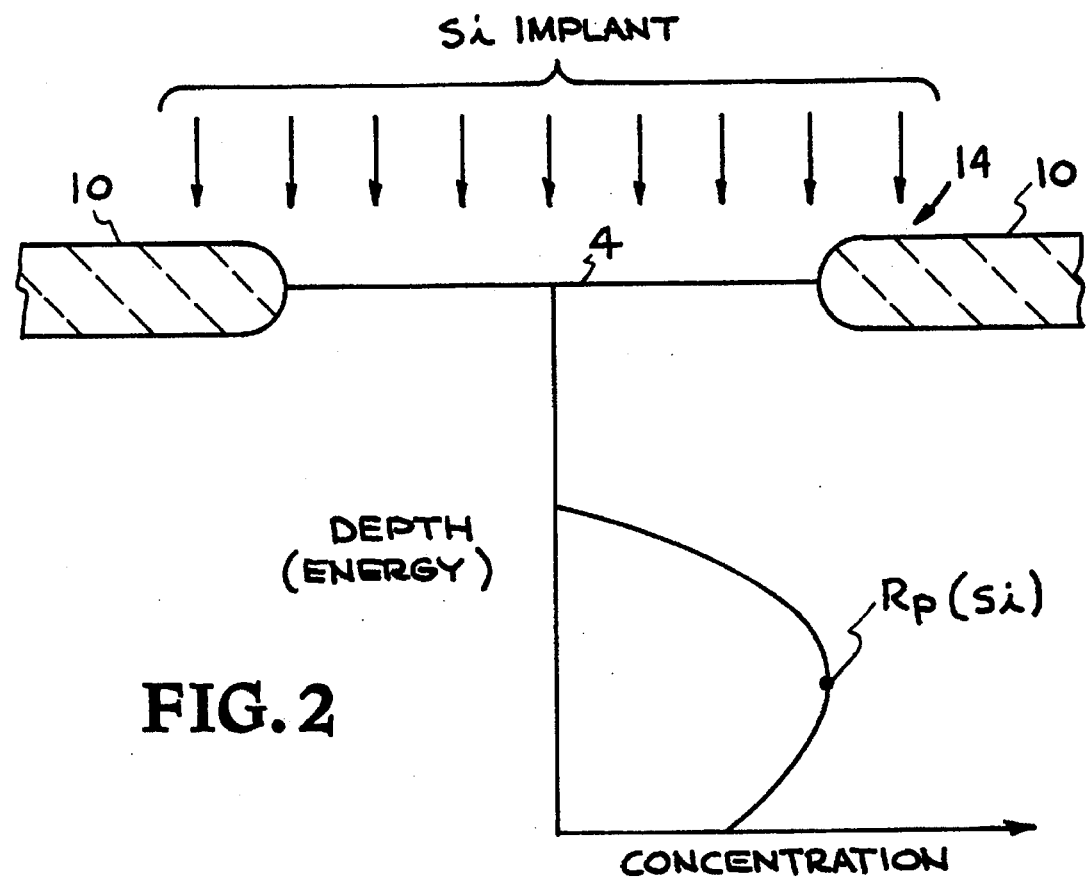
FIG. 2 is a graph superimposed over a portion of FIG. 1 to generally show the distribution and the peak (Rp) for a given dosage of silicon atoms implanted at a particular energy.

FIG. 2 shows, in graphic form, the concentration distribution in the silicon substrate of the silicon atoms shown being implanted in substrate 2 in FIGS. 1 and 2, and showing the depth, from surface 4 of substrate 2, of the peak concentration Rp of the implanted silicon atoms.

Figure 3:
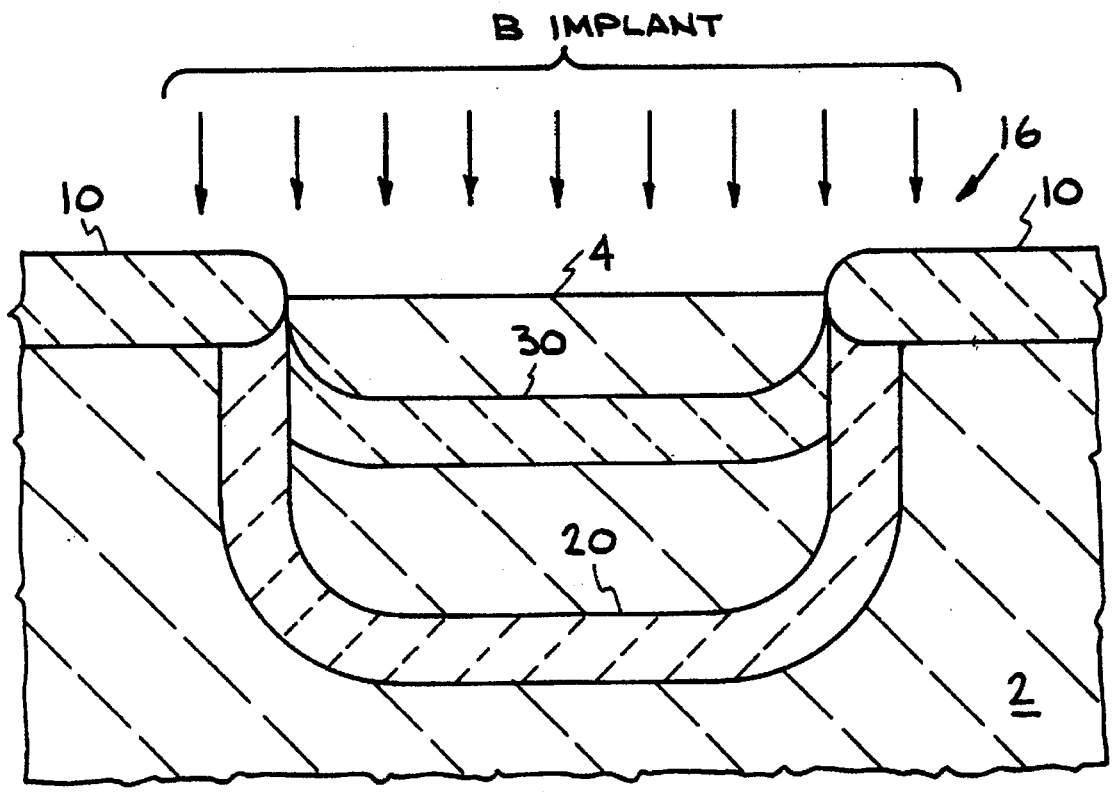
FIG. 3 is a fragmentary vertical cross-sectional view of the structure depicted in FIG. 1, after formation of the barrier region of silicon in the single crystal silicon semiconductor substrate, and after formation of a boron-doped region in the substrate above the barrier region.

FIG. 3 shows substrate 2 and barrier region 20 after completion of the implantation process to form barrier region 20 of interstitial silicon atoms in the single crystal silicon lattice in accordance with the invention. As further illustrated in FIG. 3, silicon substrate 2 is shown, at 16, being further implanted with a dopant, e.g., with a non-group IV element, illustrated as boron in the figure, to form a doped region 30 below the surface of substrate 2, but above barrier region 20 formed by the implanted interstitial silicon atoms.

The presence of the interstitial silicon atoms comprising barrier region 20 in substrate 2 prevents or inhibits migration of the dopant atoms, during the implantation, by channeling. Furthermore, subsequent annealing of the substrate, to repair damage to substrate 2 caused by the implantation steps, will result in minimized migration, by diffusion, of the dopant atoms from doped region 30, due to the presence of barrier region 20 surrounding doped region 30.

Figure 4:
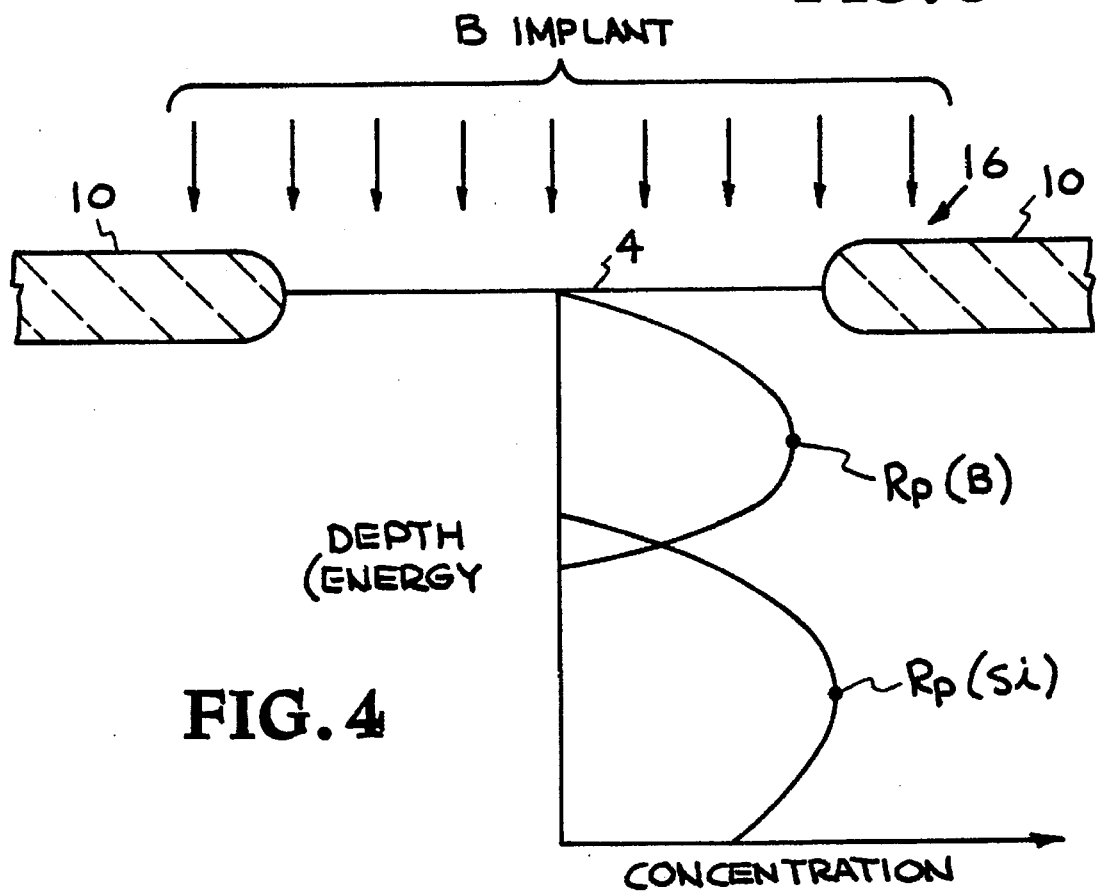
FIG. 4 is a graph superimposed over a portion of FIG. 3 to generally show the distribution and the Rp's for both the silicon atoms implanted to form the barrier region and the boron atoms implanted above the barrier region to form the doped region.

FIG. 4 shows, in graphic form, the concentration distribution in the silicon substrate of the silicon atoms shown implanted in substrate 2 in FIG. 1, and the concentration and the concentration distribution of the subsequently implanted boron atoms. The graph of FIG. 4 also shows the depth, from surface 4 of substrate 2, of the peak concentration Rp of the implanted silicon atoms and the Rp of the boron implantation as well.

The use of the term "Rp" herein, with respect to either the group IV barrier region or the doped region, is intended to define the point of the peak concentration of the implanted atoms in the particular region.

While we do not wish to be bound by any theories as to how the interstitial silicon atoms comprising barrier region 20 operate to inhibit migration, the mechanisms for such retardation are believed to be as follows: First, with respect to the inhibition of channeling of the dopant during the implantation of the dopant following formation of barrier region 20 of group IV materials, e.g., silicon; the presence of interstitial silicon atoms randomly dispersed between the silicon atoms in the single crystal lattice throughout barrier region 20 is believed to interfere with the travel of such dopant atoms through the channels between the ordered silicon atoms in the single crystal lattice, thus preventing or inhibiting such "channeling".

Second, with respect to the prevention or inhibition of the movement of the dopant atoms from doped region 30 through barrier region 20 by diffusion, dopant atoms such as boron, arsenic, and phosphorus diffuse through an ordered or single crystal lattice principally by a vacancy mechanism. The large excess of interstitial silicon atoms in barrier region 20 are available to fill such vacancies, and therefore lower the concentration of, such vacancies in the lattice. This reduction of the population of available vacancies then reduces the capability of the dopants to diffuse through barrier region 20 via such vacancies. The high population of interstitial silicon also reduces interstitial diffusion pathways. Furthermore, in any competition for a vacant lattice position, silicon is most readily accommodated, followed next by germanium. Therefore, diffusion of active dopant species, e.g., of group III or group V dopants, through single crystal group IV lattice, e.g., a single crystal silicon lattice, will be inhibited or retarded when large quantities of interstitial group IV atoms, such as silicon, are present in the single crystal group IV substrate in a region adjacent to the doped region. Therefore, as will be discussed in more detail below, the spacing or distance of the barrier region of group IV atoms in the substrate from the doped region is important to the practice of this invention to ensure the presence of such group IV interstitial atoms to fill such vacancies in preference to the filling of such vacancies by the dopant atoms, i.e., to inhibit diffusion by the dopant atoms.

It should be noted that the group IV implant to form the barrier region may be carried out before or after implantation of the dopant specie to inhibit diffusion. However, the group IV implant to form the barrier region must precede the dopant implant to inhibit channeling of the dopant. It should also be noted that the undesired migration of dopant in the single crystal group IV semiconductor wafer may be controlled or inhibited by the group IV barrier region of the invention regardless of the means of introducing the dopant into the crystal lattice of the wafer. For example, the dopant may be introduced into the crystal lattice by diffusion rather than by implantation and the barrier region will still effectively inhibit further diffusion of the dopant through the barrier region into other portions of the wafer.

Figure 5:
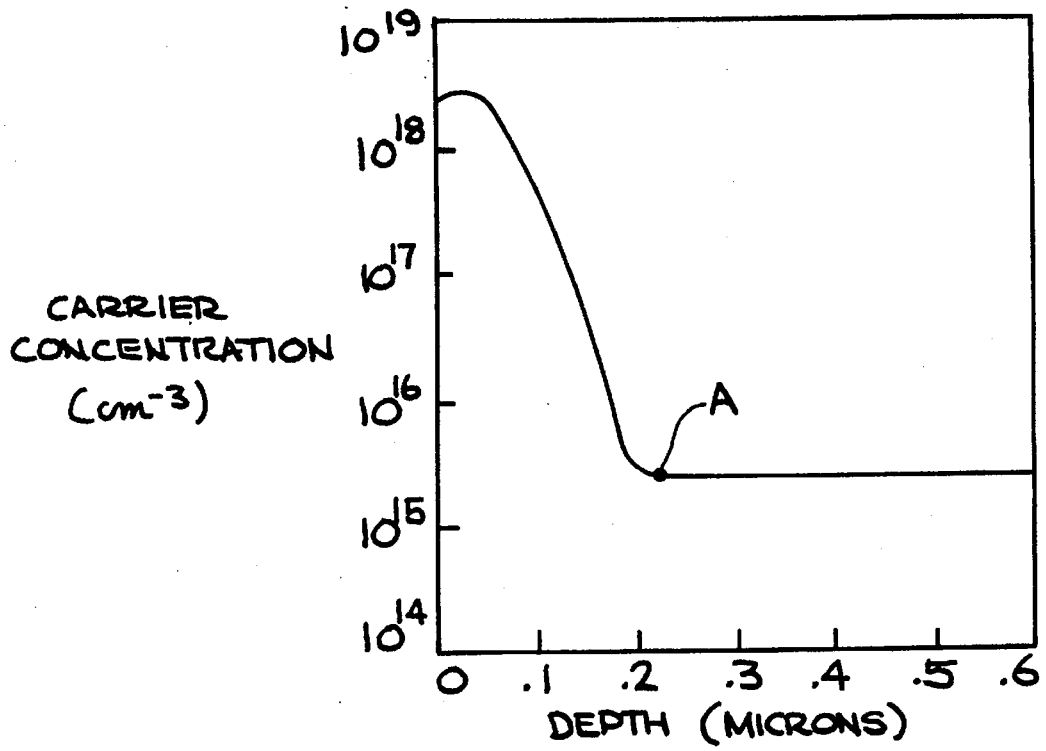
FIG. 5 is a graph showing the migration of a boron dopant, during an anneal at 850° C., in a prior art silicon substrate not containing the barrier region of the invention.

Referring now to FIGS. 5–8, comparison graphs are provided showing the migration, during annealing, of boron dopants in various silicon substrates, after implantation, using an active carrier distribution measurement technique known as Spreading Resistance Profiling (SRP). In each instance, the substrate was implanted with boron using $BF_2^+$ ions at a dosage level of $1.5 \times 10^{13}$ $BF_2^+$ ions/cm$^2$ and at an implant energy of 25 keV at room temperature. In FIG. 5, a silicon substrate, not previously treated to form the group IV barrier region of the invention, was implanted with boron and then annealed at 850° C. after the boron implantation step. Point A on the graph indicates the point of maximum diffusion of measurable amounts of the boron dopant, with the flat portion of the curve to the right of point A representing background. It will be seen that during the 850° C. anneal, the boron atoms migrate to a depth of about 0.22 micrometers (µm) or microns (2200 Angstroms).

Figure 6:
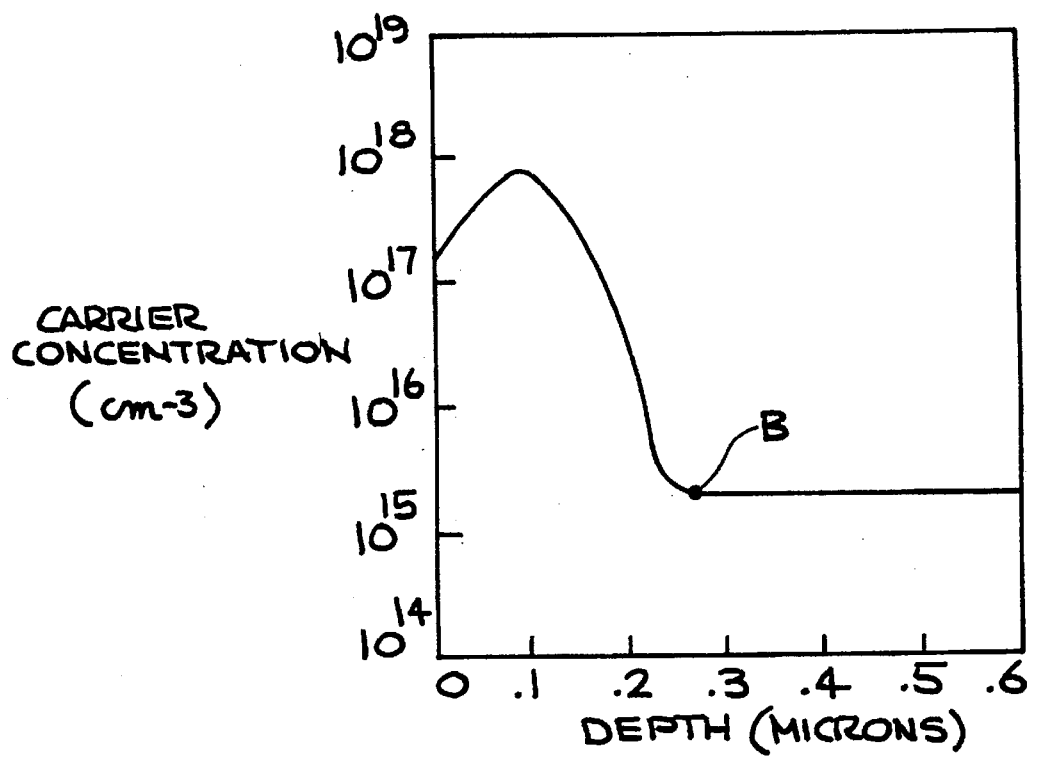
FIG. 6 is a graph showing the migration of a boron dopant, during an anneal at 900° C., in a prior art silicon substrate substantially identical to the prior art silicon substrate of FIG. 5.

However, when the annealing temperature is raised to 900° C. for a similar boron doped silicon substrate also not having the group IV barrier region formed therein, the depth of the boron migration, as shown at point B in FIG. 6, increases to about 0.26 µm (2600 Angstroms), thus showing a further migration of the implanted boron atoms of about 0.04 µm (400 Angstroms) with a 50° C. rise in annealing temperature. In other words, further heating of the doped substrate at a higher temperature produces further migration of the dopants through the substrate.

Figure 7:
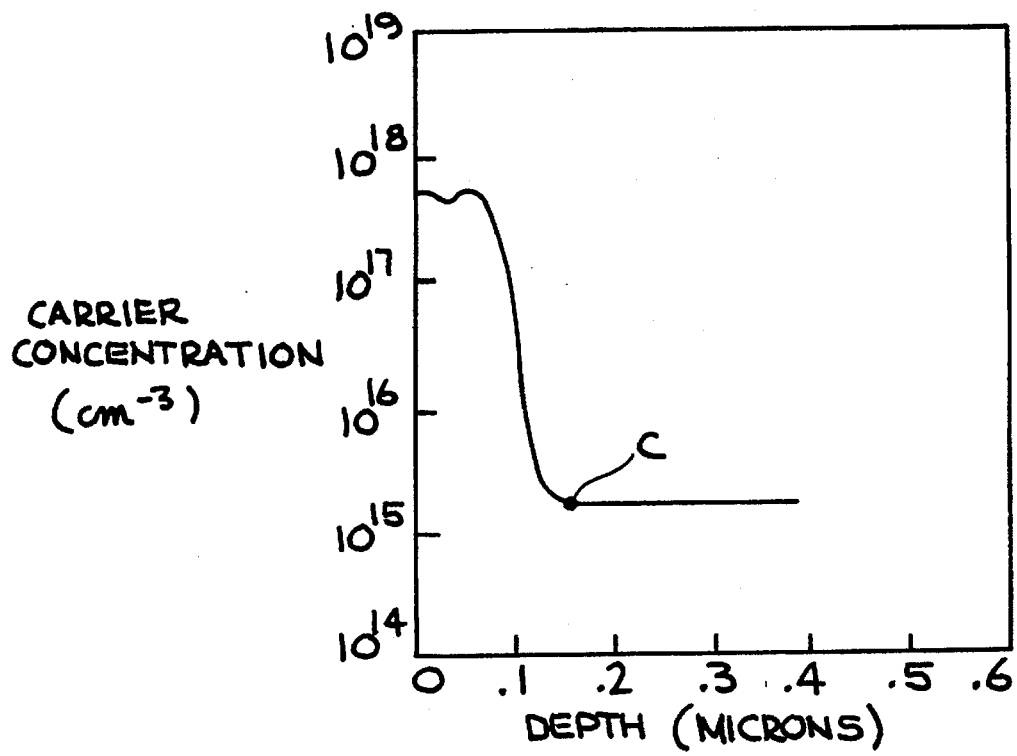
FIG. 7 is a graph showing the migration of a boron dopant, during an anneal at 850° C., in a silicon substrate treated, in accordance with the invention, to form a barrier region of silicon atoms beneath the boron doped region of the substrate.
Figure 8:
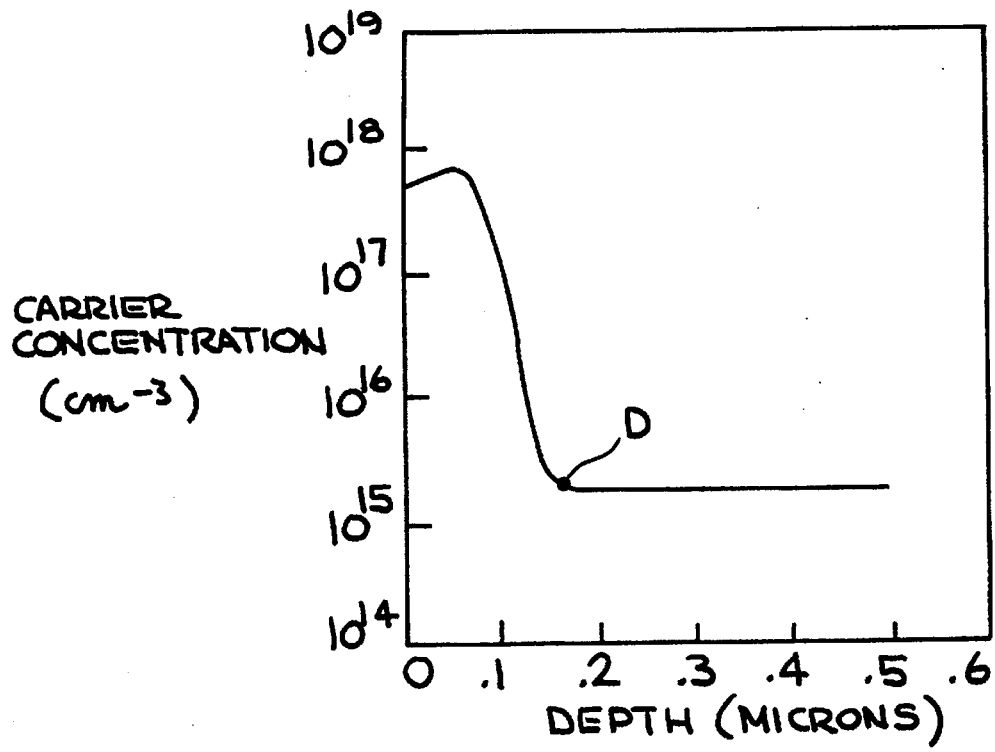
FIG. 8 is a graph showing the migration of a boron dopant, during an anneal at 900° C., in a silicon substrate substantially identical to the silicon substrate of FIG. 7, i.e., treated, in accordance with the invention, to form a barrier region of silicon atoms beneath the boron doped region of the substrate.

In comparison, the graphs of FIGS. 7 and 8 show the respective extent of the migration of the implanted boron at 850° C. and 900° C. annealing temperatures when the silicon substrate is first treated, in accordance with the invention, to form the group IV barrier region to inhibit migration of the subsequently implanted boron dopant. In FIG. 7, the boron in the substrate annealed at 850° C. has migrated to a maximum depth of about 0.16 µm (1600 Angstroms), as shown at point C; while in FIG. 8, the depth of migration of the boron annealed at 900° C. is shown at point D to also be about 0.16 µm (1600 Angstroms). Thus the presence of group IV barrier region 20 in group IV substrate 2, in accordance with the invention, substantially inhibits further migration of a subsequently implanted dopant during annealing, despite differences in annealing temperatures which, but for such a barrier region, would normally be expected to result in further migration of the dopant as the annealing temperature is increased.

By use of the term "group IV elements" herein is meant either silicon or germanium. Furthermore, while it would be preferred to implant with the same group IV element to form the barrier region as the group IV element comprising the single crystal lattice, e.g., implant a single crystal silicon substrate with silicon atoms, it is also within the scope of the invention to either implant a silicon single crystal substrate with germanium atoms to form the desired barrier region, or to implant a single crystal germanium substrate with silicon atoms to form the desired barrier region.

By use of the term "group V dopants" is meant arsenic, antimony, or phosphorus, but preferably arsenic or phosphorus. By use of the term "group III dopants" is meant boron, aluminum, indium, or gallium, but preferably boron.

Formation of the Group IV Barrier Region

Formation of the group IV barrier region in a single crystal group IV semiconductor substrate to effectively inhibit or prevent migration of subsequently implanted dopant materials in the substrate involves several related parameters. First of all, one must determine where to form the barrier region in the substrate to permit the barrier region to effectively function for its intended purpose. Location of the barrier region, in turn, is therefore usually dependent upon the location, in the substrate, of the dopant which the barrier region is intended to contain. That is, the correct spacing of the barrier region from the doped region in the substrate is important to the practice of the invention.

FIG. 4 shows the illustrated boron dopant implanted to a depth denoted as Rp (boron) signifying the location (depth) of the maximum concentration of the dopant. This depth is preselected for a particular use of the dopant, e.g., to form a source or a drain region of an MOS transistor in an integrated circuit structure, and is then controlled by the energy level used during the implantation. The depth of the dopant Rp will, in turn, have an effect on the depth of the Rp of the barrier region to be formed in accordance with the invention, to thereby provide the desired spacing between the doped region and the barrier region.

Figure 4A:
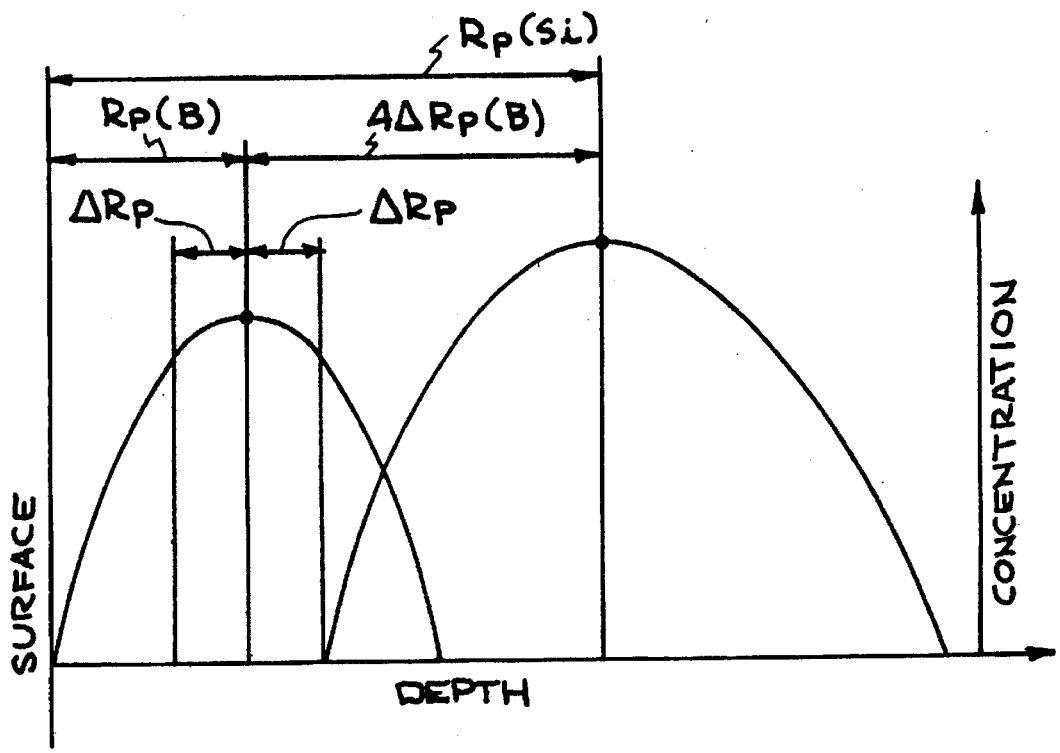
FIG. 4A is a graph of an enlarged portion of FIG. 4 generally showing the width of ΔRp (boron) and the use of the ΔRp of the dopant to define the spacing between the Rp of the silicon barrier region and the Rp of the subsequently implanted doped region.

Once the Rp of the particular dopant to be contained has been determined, usually by the intended end use, one can select the added depth to which the barrier region should be formed by implantation. That is, a distance between the Rp of the dopant region and the Rp of the barrier region can be selected. As shown in FIG. 4A, we have selected spacing values denoted in the unit "$\Delta Rp$", since the depth of the Rp of the dopant region will affect the "straggle" or distribution of the dopant and therefore affect the optimum distance to be selected between the Rp of the dopant region and the Rp of the barrier region.

The unit or term $\Delta Rp$ of the dopant is defined as ½ of the width of the area under the concentration or distribution curve in which ~65% of the dopant dosage is implanted. In FIG. 4A, the distance between the Rp of the doped boron region and the Rp of the silicon barrier region is shown as $4\Delta Rp$. In accordance with the invention, the range of the distance between the Rp of the doped region and the Rp of the silicon barrier region should vary from about ¼ $\Delta Rp$ to about 10 $\Delta Rp$ of the dopant, preferably from about 1 $\Delta Rp$ to about 6 $\Delta Rp$ of the dopant, and typically will range from about 3–4 $\Delta Rp$ of the dopant. This spacing of the dopant Rp to the group IV barrier region Rp will provide a sufficient amount of interstitial group IV atoms in the crystal lattice adjacent the doped region to inhibit the migration of the dopant atoms from the doped region.

This range of spacing of the Rp of the dopant region from the Rp of the group IV implant comprising the barrier region will ensure that the implanted group IV atoms are sufficiently spaced from the doped region so as to not interfere with the proper functioning of the doped region, yet sufficiently close to provide an overlap of the distributions of the respective group IV barrier region specie and the group III or group V dopant region. This will inhibit the migration of the group III or V dopant atoms by the presence of interstitial group IV atoms remaining in the lattice which will compete to fill any vacancies in the lattice and be favored over the dopant atoms to fill such vacancies, thus inhibiting the migration of the dopant atoms.

Once the Rp of the dopant region is known, as well as the desired spacing between the Rp of the doped region and the Rp of the group IV barrier region (the particular $\Delta Rp$ value selected), the Rp of the group IV barrier region can be derived. An implantation energy is selected which will be capable of implanting the particular group IV atoms, i.e., silicon or germanium, to this desired Rp depth of the barrier region. This may be readily obtained from published "LSS" tables, given the implanting atom, the lattice to be implanted, and the desired depth of the implant. For example, Gibbons, Johnson, and Mylroie, in "PROJECTED RANGE STATISTICS", published by Dowden, Howard & Ross, Inc. in 1975, discuss the penetration theory of Lindhard, Scharff, and Schiott, known as the LSS theory and then provide LSS tables of energies versus range of penetration for the implantation of various atoms, including silicon, boron, phosphorus, and arsenic, into a silicon lattice. An abbreviated version of the LSS table in this publication, for the implantation of silicon atoms into a silicon single crystal lattice, is listed below:

TABLE I (Implantation Energy versus Depth for Implantation of Silicon into Silicon Lattice)

| Energy (KEV) | Projected Range (µm) |
|---|---|
| 10 | 0.0150 |
| 20 | 0.0279 |
| 40 | 0.0552 |
| 50 | 0.0696 |
| 60 | 0.0845 |
| 80 | 0.1152 |
| 100 | 0.1469 |
| 120 | 0.1793 |
| 140 | 0.2121 |
| 150 | 0.2287 |
| 160 | 0.2453 |
| 180 | 0.2785 |
| 200 | 0.3118 |
| 220 | 0.3451 |
| 240 | 0.3783 |
| 260 | 0.4113 |
| 280 | 0.4441 |
| 300 | 0.4767 |
| 320 | 0.5091 |
| 340 | 0.5413 |
| 360 | 0.5731 |
| 380 | 0.6048 |
| 400 | 0.6361 |
| 420 | 0.6672 |
| 440 | 0.6980 |
| 460 | 0.7285 |
| 480 | 0.7587 |
| 500 | 0.7886 |
| 550 | 0.8623 |
| 600 | 0.9344 |
| 650 | 1.0048 |
| 700 | 1.0736 |
| 750 | 1.1410 |
| 800 | 1.2070 |
| 850 | 1.2716 |
| 900 | 1.3550 |

TABLE I-continued (Implantation Energy versus Depth for Implantation of Silicon into Silicon Lattice)

| Energy (KEV) | Projected Range (μm) |
|---|---|
| 950 | 1.3971 |
| 1000 | 1.4581 |

Once the implantation energy level necessary for the implantation, e.g., of silicon atoms into silicon is known, the dosage must be determined. The dosage amount of the group IV element used to form the barrier region in the single crystal substrate will be at least the minimum dosage needed to form a barrier region which will substantially eliminate any migration, by either diffusion or channeling, of a subsequently implanted dopant through the resulting barrier region. Typically, this will be at least to the order of magnitude of $10^{12}$ atoms/cm$^2$ to $5 \times 10^{14}$ atoms/cm$^2$.

The maximum amount of the dosage of group IV atoms will be an amount which is less than that amount which will result in amorphization of the single crystal lattice, i.e., will result only in sub-amorphization of the crystal lattice as that term has been previously defined herein. Such amorphization of the single crystal lattice can be readily ascertained in a single crystal structure by examination of the structure, after implantation, but before annealing, by Rutherford Back Scattering (RBS) analysis, which will show 100% disruption of the crystal lattice. This maximum dosage amount may be determined empirically, if necessary.

The temperature of the substrate during the implantation will also affect amorphization of the substrate as well as the energy level and dosage level. Generally the implantation will be carried out within a temperature range of from about −10° C. to as high as about 550° C. (the recrystallization temperature of silicon), preferably from about −10° C. to about 50° C., more preferably from about −10° C. to about 30° C., and typically about room temperature, i.e., from about 20° C. to about 25° C. (about 68° F. to about 77° F.).

It should be noted that the parameters for forming the barrier region may also be determined empirically. For example, once the desired implantation depth of the dopant is known, one may arbitrarily select a spacing between the Rp of the dopant and the Rp of the group IV barrier region and then determine from published LSS tables the energy level needed to implant the group IV atoms the desired depth into the particular group IV substrate (the desired depth of the Rp of the dopant plus the desired spacing between the dopant Rp and the barrier region Rp). For example, one would use Table I above to determine the energy level needed for a given depth of implant of silicon into a silicon substrate. The dosage level of the particular group IV atom could then be determined empirically, for example, by first selecting a dosage which results in amorphization of the group IV substrate (as determined by the aforesaid (RBS) analysis procedure), and then gradually reducing the dosage and/or raising the implantation temperature of the substrate, until amorphization did not occur. Alternatively, one could start with an arbitrary minimum dosage and then gradually increase the dosage until migration of the dopant through the barrier region was no longer measurable, using the same Spreading Resistance Profiling (SRP) measurement technique used to measure the migration of dopant described above in connection with the graphs of FIG. 5–8.

It should be noted, with regard to use of the empirical method, that while mass, temperature, implant energy, and dosage conventionally all enter into the determination of an implantation which will result in the amorphization of a crystal lattice, in actuality a case can be made that control of the dosage alone will prevent amorphization. For formation of a barrier region in a group IV semiconductor lattice, the mass of the implanting atom is known; the implantation temperature will generally be controlled during the implantation to prevent excessive heat generation during the implantation which could be deleterious to either the group IV substrate or integrated circuit structures already formed thereon; and the implantation energy will be fixed based on the desired depth of the implant, i.e., the spacing of the Rp of the barrier layer from the Rp of the dopant.

Thus, even using a totally empirical method, control of the single unencumbered or independent variable of dosage can provide the necessary minimum amount of implanted group IV atoms to provide the desired functional barrier region and also avoid an excessive amount of implanted group IV atoms which would result in amorphization of the crystal lattice.

In another embodiment of the invention, a shallow Group IV barrier region may also be formed in the Group IV semiconductor substrate to a depth less than that of the doped region, i.e., closer to the surface of the substrate. For example, such a shallow barrier region would be useful when a retrograde well is formed in the Group IV substrate and it is desired to inhibit migration of the dopant back toward the surface of the Group IV substrate. Such a shallow Group IV barrier region may be used alone or in combination with the previously described Group IV barrier layer implanted to a depth exceeding that of the doped region.

Figure 16:
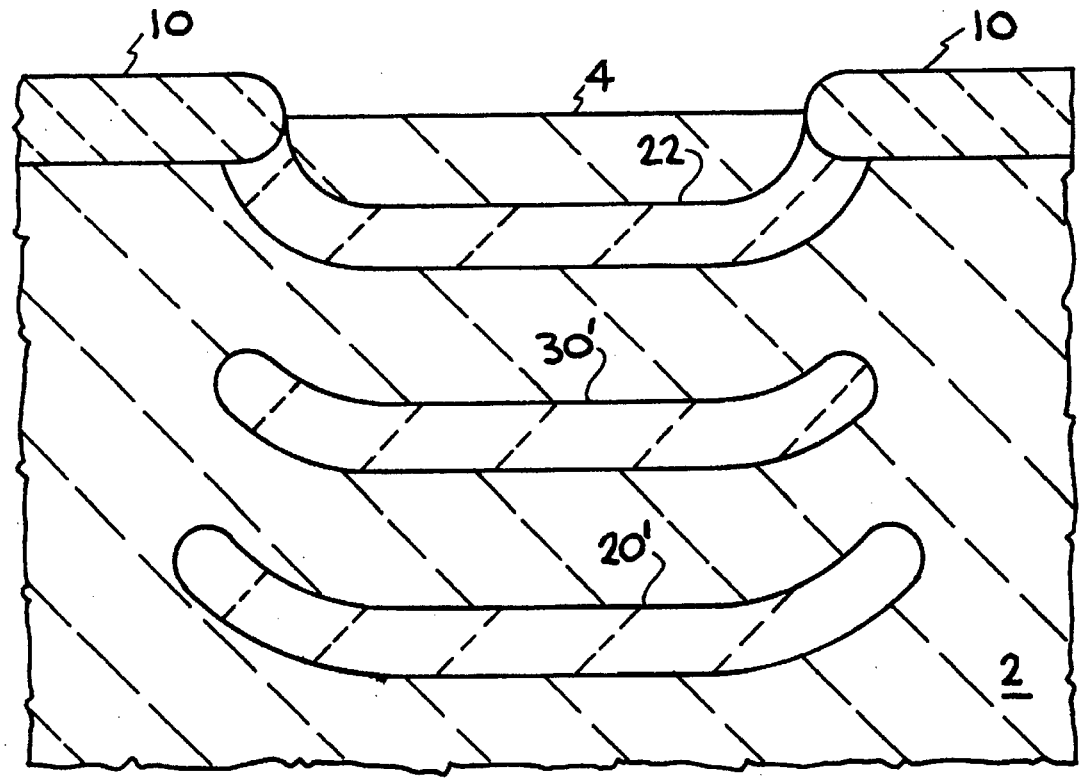
FIG. 16 is a fragmentary vertical cross-sectional view of another embodiment of the invention similar to the structure depicted in FIG. 3, except that after the formation of the lower or deeper barrier region of silicon in the single crystal silicon semiconductor substrate, and after subsequent formation of a boron-doped region in the substrate above this deeper barrier region, a second shallower barrier region of silicon is shown formed in the silicon substrate.

Thus, turning to FIG. 16, a first barrier region 20' is implanted in silicon substrate 2 followed by formation of a doped region 30', and then a second Group IV barrier region 22 is implanted to a depth less than that of doped region 30'. Naturally, first Group IV barrier region 20' will normally be implanted to a depth greater than that of previously described Group IV barrier region 20, since doped region 30' will normally be formed at a greater depth than previously described doped region 30 in FIG. 4. However, the same methods previously described for determining the spacing between the respective Rps of barrier region 20 and doped region 30 will apply equally to the spacing between the respective Rps of barrier region 20' and doped region 30'.

With respect to the spacing between the Rps of doped region 30' and second barrier region 22, the spacing will usually vary from about ¼ ΔRp to about 6 ΔRp, and preferably from about ½ ΔRp to about 3 ΔRp. Typically for a boron doped region, the spacing from the Rp of the doped region to the Rp of the second or shallow barrier region will be about 1 ΔRp, while for phosphorus the spacing will be about 2 ΔRp. As in the previously described embodiment, the dosage will be sufficient to form a barrier region to substantially eliminate any migration of the dopant, but insufficient to result in amorphization of the Group IV substrate. Typically this will be about $3 \times 10^{14}$ atoms/cm$^2$ for silicon. The implantation energy for the Group IV implant to form the second Group IV barrier layer will vary with the desired depth of the implant. For example, for a 500 keV phosphorus implant, one would typically implant silicon with an implant energy of about 570 keV prior to the phosphorus implant (for the deep silicon implant), and then implant silicon again using an implant energy of about 220 keV (for the shallow silicon implant). This corresponds to locating the respective silicon Rps at +2ΔRp and −2ΔRp from the phosphorus Rp.

The following examples will serve to further illustrate the process and product of the invention.

Example I

Figure 10:
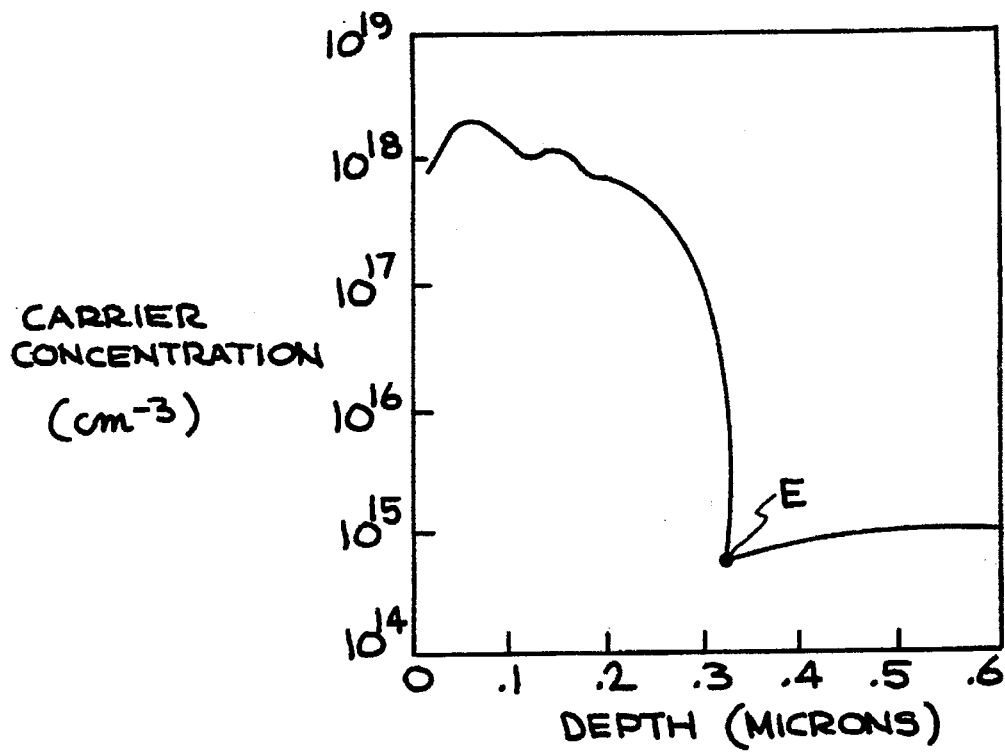
FIG. 10 is a graph showing the migration of a phosphorus dopant, during an anneal at 850° C., in a prior art silicon substrate not containing the barrier region of the invention.
Figure 11:
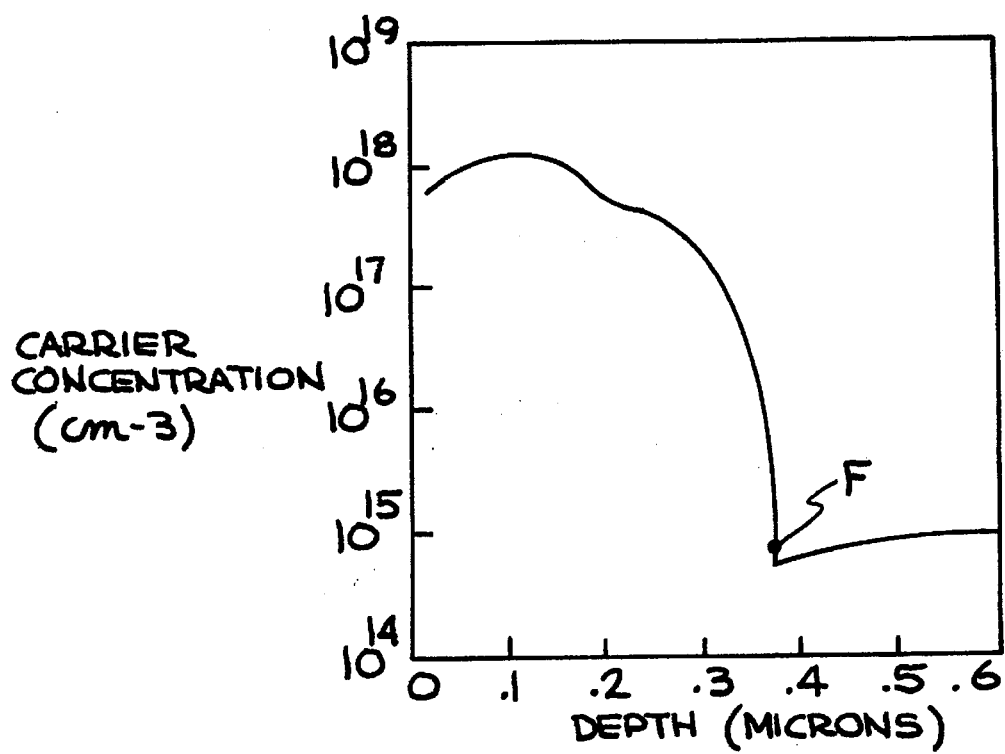
FIG. 11 is a graph showing the migration of a phosphorus dopant, during an anneal at 900° C., in a prior art silicon substrate substantially identical to the prior art silicon substrate of FIG. 10.

Two single crystal silicon substrates, maintained at a temperature of 21° C., were each subjected to a phosphorus implantation at a dosage level of $3.0 \times 10^{13}$ atoms/cm$^2$ and at an energy level of 30 keV to form phosphorus implanted regions in the respective substrates, each having an $R_p$ at a depth of about 0.04 µm, representative of prior art dopant implantations without the barrier region of the invention. One of the substrates was then annealed for 30 minutes at 850° C. and the other substrate was annealed at 900° C. The migration of the implanted phosphorus dopants in each of the two substrates was measured by Spreading Resistance Profiling (SRP), as respectively shown in FIGS. 10–11. FIG. 10 shows a migration of the implanted phosphorus dopant to a depth of about 0.3 µm, after an anneal at 850° C., while FIG. 11 shows a migration of the implanted phosphorus dopant to a depth of about 0.4 µm after annealing at 900° C., showing in both instances, considerable migration, as well as showing an annealing temperature-dependence on the extent of the migration. Thus, the phosphorus dopant, without the proximate presence in the crystal lattice of the group IV barrier region of the invention, shows the same propensity to migrate (and the same annealing temperature dependence) as the boron dopant previously illustrated in FIGS. 5 and 6.

Example II

Figure 12:
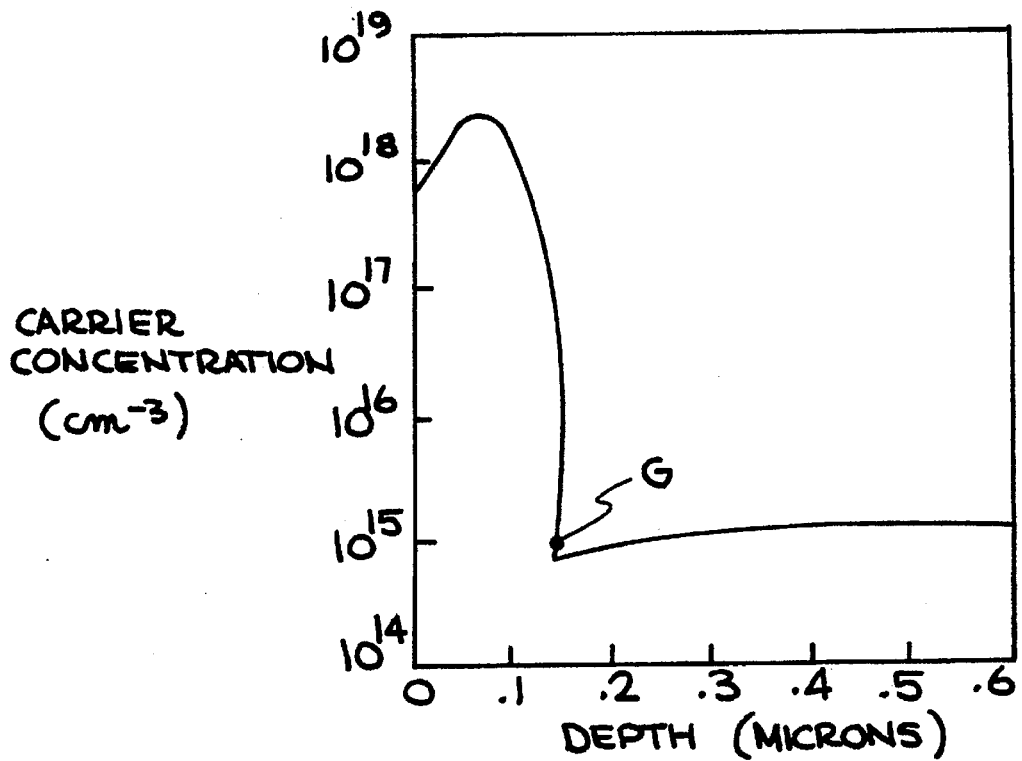
FIG. 12 is a graph showing the migration of a phosphorus dopant, during an anneal at 850° C., in a silicon substrate treated, in accordance with the invention, to form a barrier region of silicon atoms beneath the phosphorus doped region of the substrate.

To illustrate the reduction in diffusion and channeling of the phosphorus dopant by the presence of the group IV barrier region of the invention, a single crystal silicon substrate, maintained at a temperature of 21° C., was first implanted with silicon atoms at a dosage level of $3.0 \times 10^{14}$ atoms/cm$^2$ and at an energy level of 70 keV to form a silicon barrier region having an $R_p$ at a depth of approximately 0.1 µm. The substrate was then subjected to a phosphorus implantation at a dosage level of $3.0 \times 10^{13}$ atoms/cm$^2$ and at an energy level of 30 keV to form a phosphorus implanted region having an $R_p$ at a depth of about 0.04 µm. The substrate was then annealed for 30 minutes at 850° C. and the migration of the implanted phosphorus dopant was measured by Spreading Resistance Profiling (SRP), as shown in FIG. 12. The results show a marked reduction in the extent of phosphorus migration due to the presence of the silicon barrier region formed in the substrate in accordance with the invention.

Example III

Figure 13:
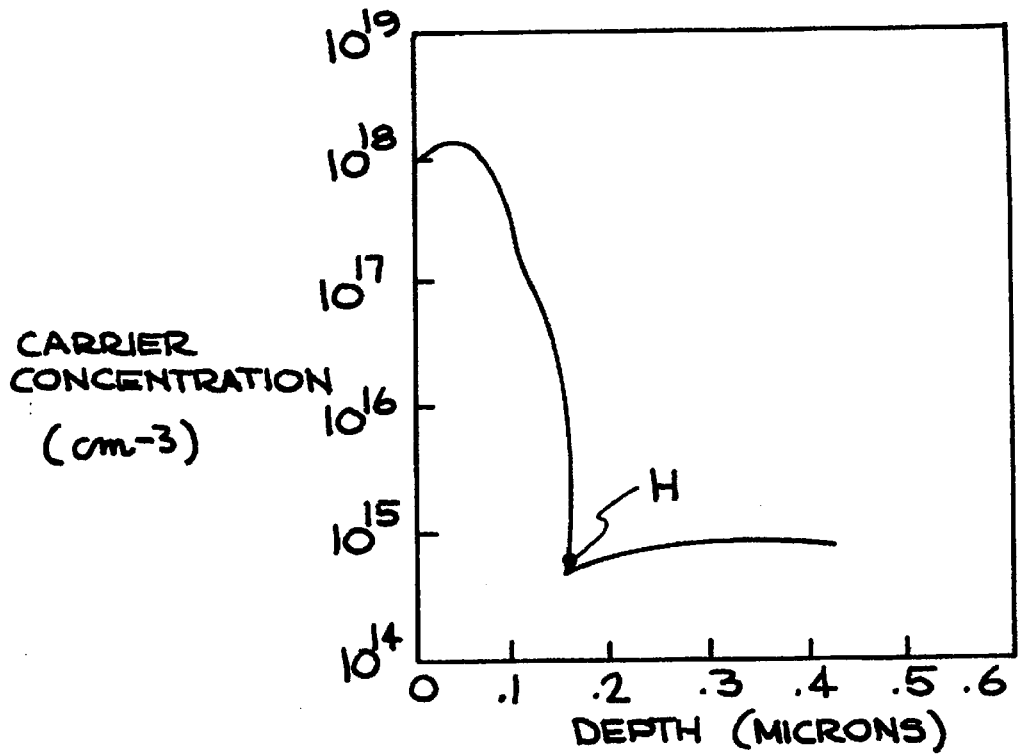
FIG. 13 is a graph showing the migration of a phosphorus dopant, during an anneal at 900° C., in a silicon substrate substantially identical to the silicon substrate of FIG. 12, i.e., treated, in accordance with the invention, to form a barrier region of silicon atoms beneath the phosphorus doped region of the substrate.

To illustrate the reduction in dopant migration change due to differences in annealing temperatures when the group IV barrier region of the invention is present in the substrate, another substrate was prepared under the same conditions as in Example II, i.e., the same silicon barrier region and phosphorus dopant region were formed, except that the substrate was then annealed at 900° C. for 30 minutes. This annealed substrate was then examined, again using SRP, to determine whether or not further migration of the implanted phosphorus had occurred, due to the higher temperature of the anneal. The measurement, as illustrated in FIG. 13, showed very little additional migration of the implanted phosphorus, compared to the previous sample shown in FIG. 12, indicating that the previously formed barrier region of implanted silicon was again successfully inhibiting or preventing the normal additional migration of the implanted phosphorus which would otherwise be expected to occur with an increase in the annealing temperature, and further showing that the samples of Example II and III both have a concentration profile contained below a depth of 0.14 µm, i.e. show very little migration of the dopant compared to the substrates of Example I shown in FIGS. 10 and 11. These results are similar to the results previously discussed with regard to the boron implant and illustrated in FIGS. 7 and 8.

The depth of the silicon barrier region, and the energy level and dosage of the silicon implant to form the silicon barrier region in Examples II and III were determined as follows: First of all, it was known that the phosphorus implantation was to be carried out to an Rp depth of 0.04 µm and that the desired spacing from the phosphorus Rp to the Rp of the silicon barrier region was to be 4ΔRp. The value of ΔRp(phosphorus) was then determined from the previously discussed LSS tables, i.e., ΔRp(phosphorus)=1660 Angstroms (0.017 µm)

4ΔRp(phosphorus)=4×0.017 µm=0.07 µm

Once the value of 4ΔRp(phosphorus) was determined, it was added to the desired depth of the Rp of the phosphorus implant (0.04 µm) to determine the depth of the Rp of the desired implanted silicon barrier region. That is, the depth of the Rp of the silicon barrier region will then be:

Rp(phosphorus)+4ΔRp(phosphorus)=0.04 µm+0.07 µm=~0.1 µm.

Figure 14:
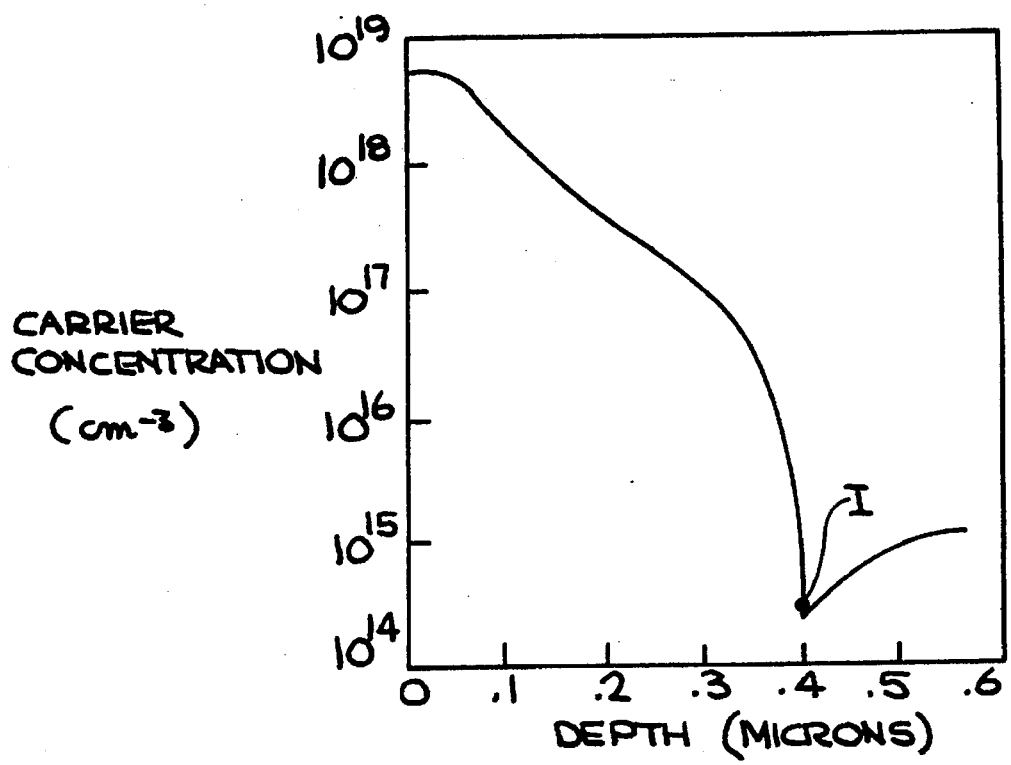
FIG. 14 is a graph showing the migration of an arsenic dopant, during an anneal at 900° C., in a prior art silicon substrate not containing the barrier region of the invention.
Figure 15:
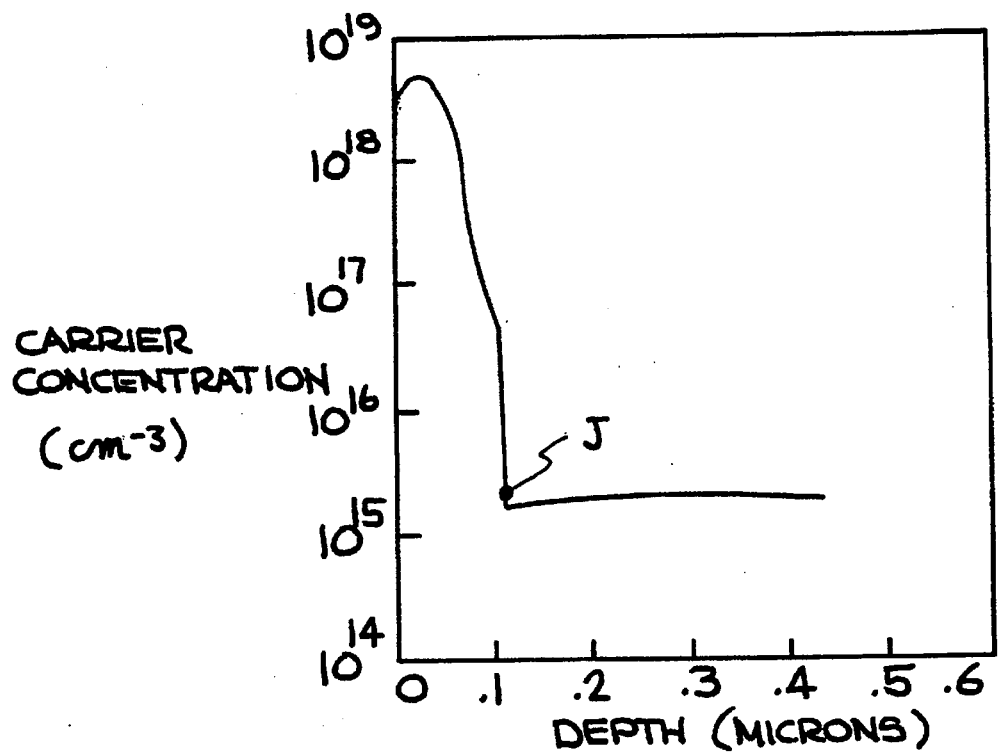
FIG. 15 is a graph showing the migration of an arsenic dopant, during an anneal at 900° C. in a silicon substrate treated, in accordance with the invention, to form a barrier region of silicon atoms beneath the arsenic doped region of the substrate.

The appropriate energy level was then selected from Table I to achieve this depth of implantation of the silicon atoms. The dosage level for the silicon implant was chosen to be an order of magnitude greater than the phosphorus implant dose, but below that which would cause amorphization of the crystal lattice of the substrate. Similar results to those obtained in Examples II and III were obtained when arsenic was substituted as the dopant instead of phosphorus. As respectively shown in FIGS. 14 and 15 (which both represent dopant anneals at 900° C.), when the group IV barrier layer is not present (FIG. 14), there is considerable migration of the dopant, whereas the presence of the group IV barrier layer implanted in the crystal lattice of the substrate, as shown in FIG. 15, results in a marked reduction in the migration of the arsenic atoms in the crystal lattice.

Having thus described the invention what is claimed is:

1. A process for forming a group IV single crystal semiconductor substrate having first and second barrier regions in said substrate comprising implanted group IV atoms capable of inhibiting migration through said substrate of dopant atoms in a doped region in said semiconductor substrate which comprises:

a) implanting said group IV single crystal semiconductor material with group IV atoms to form said first barrier region without amorphizing said single crystal substrate, at a depth of the Rp of said group IV first barrier region, with respect to the Rp of said doped region, ranging from about ¼ ΔRp to about 10 ΔRp of said dopant; and b) forming a second barrier region between said doped region and a surface of said substrate by implanting said group IV single crystal semiconductor material with group IV atoms to form said second barrier region without amorphizing said single crystal substrate.

2. The process of claim 1 wherein said step of implanting said substrate with said group IV atoms to form said first and second barrier regions further comprises implanting a single crystal silicon substrate with group IV atoms selected from the group consisting of germanium and silicon.

3. The process of claim 1 which includes the further step of implanting said group IV single crystal semiconductor substrate with one or more dopants selected from the group consisting of group III and group V atoms to form said doped region in said substrate between said first and second barrier regions in said substrate, wherein said first and second barrier regions will inhibit migration of said dopant from said doped region upon subsequent annealing of said substrate.

4. A process for forming a group IV single crystal semiconductor substrate having a barrier region in said substrate comprising implanted group IV atoms which comprises:

a) forming a doped region in said substrate;

b) implanting Group IV atoms in said substrate between said doped region and a surface of said substrate without amorphizing said single crystal substrate to form a first barrier region of interstitial group IV atoms in said substrate spaced from said doped region a distance between the Rp of said first barrier region and the Rp of said dopant region which ranges from about ¼ ΔRp to about 6 ΔRp of the dopant in said doped region; and c) forming a second barrier region at least partially below said doped region in said substrate.

5. The process of claim 4 wherein said semiconductor substrate comprises a single crystal silicon group IV semiconductor substrate and said barrier region in said substrate also comprises single crystal silicon semiconductor material having interstitial group IV atoms implanted therein selected from the group consisting of germanium and silicon.

6. The process of claim 4 wherein said doped region located beneath said barrier region and said surface of said substrate contains a dopant selected from the group consisting of group III and group V dopants.

7. A process for forming a single crystal group IV semiconductor substrate having a doped region and barrier regions in said substrate above and below said doped region comprising:

a) implanting the crystal lattice of said single crystal group IV substrate with Group IV atoms to form a first barrier layer of interstitial group IV atoms implanted therein without amorphizing said single crystal substrate;

b) forming a doped region in said substrate between a portion of said first barrier region and a surface of said substrate;

c) spacing said first barrier region a distance between the Rp of said first barrier region and the Rp of said dopant region which ranges from about ¼ ΔRp to about 10 ΔRp of the dopant in said doped region; and d) implanting the crystal lattice of said single crystal group IV substrate with Group IV atoms to form a second barrier layer of interstitial group IV atoms implanted therein between said doped region and said surface of said substrate without amorphizing said single crystal substrate;

whereby said first and second barrier regions of interstitial group IV atoms are capable of inhibiting migration therethrough of dopant atoms from said doped region in said group IV semiconductor substrate.

8. The process of claim 7 which further comprises spacing said second barrier region from said doped region a distance between the Rp of said second barrier region and the Rp of said dopant region which ranges from about ¼ ΔRp to about 6 ΔRp of the dopant in said doped region.

9. The process of claim 8 wherein the distance between the Rp of said first barrier region and the Rp of said dopant region ranges from about 1 ΔRp to about 6 ΔRp of said dopant.

10. The process of claim 8 wherein said doped region located between said first and second barrier regions in said substrate contains a dopant selected from the group consisting of group III and group V dopants.

11. The process of claim 10 wherein said doped region is formed by implanting said substrate with a dopant selected from the group consisting of boron, phosphorus, and arsenic.

12. A process for forming a doped single crystal silicon semiconductor substrate having a doped region and barrier regions capable of retaining said doped region within said substrate which comprises:

a) forming a first barrier region of interstitial atoms in said substrate spaced from a surface of said single crystal silicon substrate by implanting interstitial group IV atoms therein without amorphizing said single crystal substrate;

b) forming a doped region in said substrate between said surface and said first barrier region comprising implanted dopant atoms selected from the group consisting of boron, phosphorus, and arsenic; and c) forming a second barrier layer of interstitial atoms in said substrate between said doped layer and said surface of said single crystal silicon substrate without amorphizing said single crystal substrate by implanting interstitial group IV atoms therein spaced from said doped region a distance between the Rp of said second barrier region and the Rp of said dopant region which ranges from about ¼ ΔRp to about 6 ΔRp of the dopants in said doped region;

wherein said first and second barrier regions are capable of inhibiting migration therethrough of dopants atoms implanted in said silicon semiconductor substrate to form said doped region.

13. The process of claim 12 which further comprises spacing the Rp of said first barrier region and the Rp of said dopant region within the range of from about 1 ΔRp to about 6 ΔRp of said dopant.

14. The process of claim 12 wherein said steps of implanting said substrate with said group IV atoms to form said barrier regions further comprises implanting a single crystal silicon substrate with group IV atoms selected from the group consisting of germanium and silicon.

* * * * *

UNITED STATES PATENT AND TRADEMARK OFFICE
CERTIFICATE OF CORRECTION

PATENT NO. : 5,654,210
DATED : August 5, 1997
INVENTOR(S) : Sheldon Aronowitz and James Kimball It is certified that error appears in the above-indentified patent and that said Letters Patent is hereby corrected as shown below:

Title Page:

Item [56], References Cited, Other Publications, line 5, change "$BF_{2+}$" to "$BF_2^+$".

Col. 14, line 41, Claim 12, change "dopants" to "dopant".

Col. 14, line 44, Claim 12, change "dopants" to "dopant".

Signed and Sealed this

Second Day of December, 1997

Attest:

BRUCE LEHMAN

Attesting Officer

Commissioner of Patents and Trademarks